United States Patent [19]
Loving, Jr.

[11] 3,740,658
[45] June 19, 1973

[54] TEMPERATURE COMPENSATED AMPLIFYING CIRCUIT

[75] Inventor: Robert O. Loving, Jr., Streamwood, Ill.

[73] Assignee: Motorola, Inc., Franklin Park, Ill.

[22] Filed: Mar. 3, 1970

[21] Appl. No.: 16,156

[52] U.S. Cl. .................. 330/23, 330/22, 330/30 D, 330/38 M

[51] Int. Cl. ............................................ H03f 1/32

[58] Field of Search .................... 330/22, 23, 30 D, 330/38 M, 40, 69, 21, 31

[56] References Cited

UNITED STATES PATENTS 3,522,548 8/1970 Heuner et al. ........................ 330/23

*Primary Examiner*—Roy Lake
*Assistant Examiner*—Lawrence J. Dahl
*Attorney*—Mueller & Aichele

[57] ABSTRACT

An integrated circuit differential amplifier incorporates dual current sources having opposite temperature coefficients to compensate the operation of the differential amplifier for variations in ambient temperature. The output of the differential amplifier is applied through a coupling network to a peak-to-peak amplifying detector subject to input impedance variations, with the coupling network including an impedance connected in parallel with the input impedance of the detector circuit and of smaller value.

7 Claims, 1 Drawing Figure

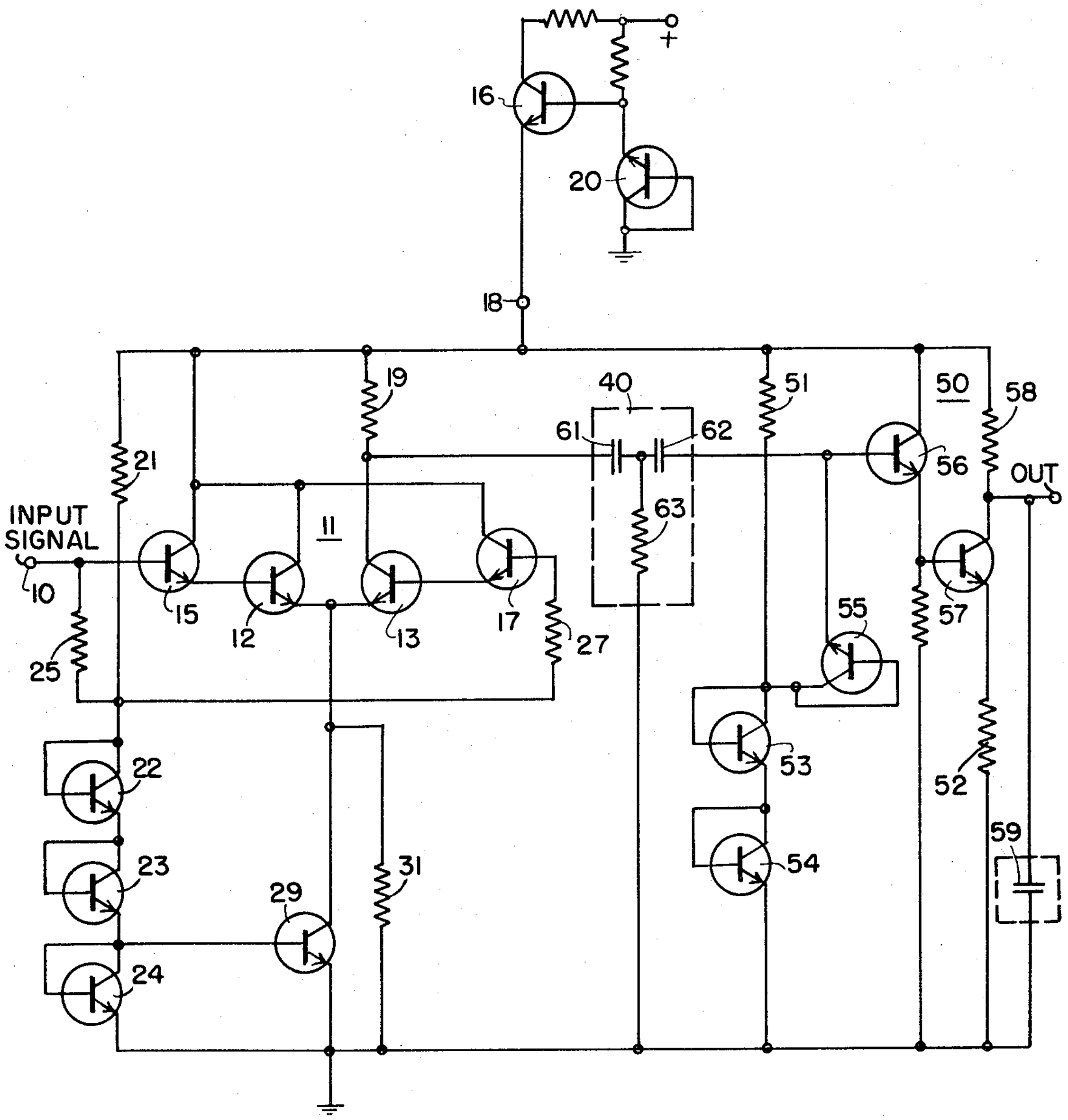
INVENTOR
ROBERT O. LOVING, JR.
BY
Mueller, Aichele & Rauner
ATTYS.

TEMPERATURE COMPENSATED AMPLIFYING CIRCUIT

BACKGROUND OF THE INVENTION

Integrated circuit amplifier operating from a DC voltage supply, which is subject to variations with variations in ambient temperature, exhibit variations in gain in accordance with the temperature coefficients of the voltage dividing network and the constant current source coupled to the differential amplifier. To overcome this problem it has been necessary to provide a highly regulated DC supply and to utilize discrete resistors, external to the integrated circuit chip, in the voltage divider string for providing the reference voltage to the circuit and exhibiting relatively flat characteristics with respect to temperature variations. Such resistors result in increased cost and additional bonding pads must be provided on the integrated circuit chip. If a regulated power supply is used, an increased cost resulting from the addition of the regulating circuitry is encountered.

Furthermore, it has been found that for integrated circuit chips made from different batches, the beta of the transistors formed on the chip may vary over a relatively wide range. This causes variations in the input impedances of single-ended input stages, which may result in substantial variations in the operation of the circuits formed from different batches. In addition, ambient temperature variations result in variations of the input impedance of such stages. Thus, it is desirable to provide coupling circuits between stages which can render the input impedance variations of a succeeding stage relatively insignificant, whether these impedance variations are caused by variations in the beta of the transistors of the succeeding stage or by input impedance variations caused by changes in the ambient temperature in which the integrated circuit chip is operated.

SUMMARY OF THE INVENTION

Accordingly, it is an object of this invention to provide an improved temperature-compensated integrated circuit amplifier.

It is another object of this invention to couple an input stage of a circuit to a utilization stage, subject to input impedance variations, through a coupling circuit which substantially reduces the effects of such variations in the input impedance of the utilization stage.

It is a further object of this invention to provide an integrated circuit differential amplifier with dual current sources, each having opposite temperature coefficients.

It is an additional object of this invention to utilize a sequence of series-connected transistor diodes to provide a reference voltage for operating an integrated circuit differential amplifier and, in addition, to function as an AC decoupling means for one of the inputs of the differential amplifier.

In accordance with a preferred embodiment of this invention, an integrated circuit differential amplifier, subject to variations in gain with variations in the ambient temperature in which the amplifier is operated, is provided with first and second parallel current sources, one having a positive coefficient of temperature and the other having a negative temperature coefficient. By proper choice of the parameters of the current sources, the temperature-caused variations in the differential amplifier operating current (and therefore its gain) may be adjusted between the two extremes (including zero) provided by the current sources.

In addition, a utilization stage, subject to variations of input impedance with the beta of the transistors used in that utilization stage and subject to variations in input impedance with variations in the ambient temperature of the circuit, is compensated by an input coupling circuit having an impedance coupled in parallel with the input impedance of the utilization stage, with the compensation impedance being low compared to the input impedance of the utilization circuit so that it effectively swamps out the effects of variations in the input impedance of the utilization circuit.

BRIEF DESCRIPTION OF THE DRAWINGS

The sole FIGURE of the drawing is a schematic diagram of a preferred embodiment of the invention.

DETAILED DESCRIPTION

Referring now to the drawing, there is shown a temperature-compensated integrated circuit amplifier and noise detector circuit which may be utilized in a radio receiver for operating a noise activated squelch circuit. Input signals to the amplifier circuit shown in the drawing may be obtained from the output of the discriminator of the radio receiver (not shown) and are applied to an input terminal 10. Prior to being applied to the input terminal 10, an input shaping network may be used to establish the ratio of the audio-to-noise voltage which drives a first stage differential amplifier 11, and the amplifier 11 may be driven into limiting by the audio voltage to eliminate blocking (undesired squelching in response to audio signals).

The differential amplifier 11 is connected in a Darlington configuration, including first and second NPN transistors 12 and 13, each forming an output transistor of a Darlington pair including input transistors 15 and 17, respectively.

Operating potential for the integrated circuit is obtained from a source of regulated positive potential applied to a terminal 18, with the collectors of the transistors 12, 15 and 17 being connected directly to the terminal 18, and with the collector of the amplifier output transistor 13 being connected through a load resistor 19 to the terminal 18. The regulated potential is obtained from an emitter follower 16 driven by the voltage drop across a transistor Zener diode 20.

The DC potential applied to the terminal 18 may vary with variations in the ambient temperature and has a positive temperature coefficient, so that temperature compensation of the amplifier circuit 11 must be effected in order to eliminate output variations due to the changes in the DC supply potential. Operating bias potential for the differential amplifier 11 is obtained from a voltage divider formed as part of the integrated circuit and including a resistor 21 and three transistor diodes 22, 23 and 24 connected in series between the terminal 18 and ground. The transistor diodes 22–24 are commonly employed in integrated circuit applications and are formed by shorting the collectors to the bases, so that the collector-base connections form the diode anodes and the emitters of the transistor diodes are comparable to diode cathodes. The voltage drop across the diodes 22, 23 and 24 is coupled to the bases of the transistors 15 and 17 through coupling resistors 25 and 27, respectively, with the relative values of the resistors 25 and 27 being chosen to produce negligible voltage drops due to the base currents drawn by the transistors 15 and 17.

A first current source for the differential amplifier 11 is provided by coupling the emitters of the transistors 12 and 13 together to the collector of an NPN current source transistor 29, the emitter of which is coupled to ground and the base of which is provided with a reference potential from the collector of the transistor diode 24. Since the transistor diode 24 and the current source transistor 29 both are formed as part of the same integrated circuit chip, the transistor parameters are essentially equal; so that the collector current of the transistor 29 is essentially equal to the current flowing through the transistor diode 24. The current flowing through the transistor diode 24 however, is determined by the value of the resistor 21, the value of the supply voltage applied to the terminal 18, and the diode voltage drops of the transistor diodes 22 and 23.

As the ambient temperature in which the circuit is operated varies, the characteristics of the resistor 21 and the transistor diodes 22, 23 and 24 also vary, with the resistor 21 exhibiting a positive temperature coefficient and the voltage drops of the diodes 22, 23 and 24 exhibiting negative temperature coefficients. The net effect of these varying temperature coefficients is such as to cause the collector current of the transistor 29 to have a positive temperature coefficient; that is, as the ambient temperature increases, the collector current of the transistor 29 increases. Since this current is the current of the current source and since the gain of the differential amplifier 11 is proportional to the current coupled to the emitters of the transistors 12 and 13, this results in an increase in the gain of the amplifier. This is an undesirable characteristic.

In order to compensate for the variations in gain of the amplifier 11 caused by variations in temperature, an additional current source for the differential amplifier 11 is provided by connecting a resistor 31 in parallel with the transistor 29 between ground and the emitters of the transistors 12 and 13. The resistor 31 is formed as part of the integrated circuit and has a positive temperature coefficient.

It can be seen that two of the three transistor diode voltage drops formed by the transistor diodes 22, 23 and 24 are approximately cancelled out by the base-emitter voltage drops of the transistors 12 and 15 or 13 and 17, so that a single diode voltage drop is left to appear across the resistor 31. The negative temperature coefficient of this diode voltage drop and the positive temperature coefficient of the resistor are established by the circuit geometry to yield a net negative coefficient of the current through the resistor 31.

Thus, by a proper choice of the resistors 21 and 31, any net temperature coefficient of the amplifier operating current (and therefore gain) may be obtained between the two extremes provided by the current sources of the current source transistor 29 and the parallel-connected current source resistor 31. For the purposes of this description, the relative value of these two resistors are chosen to cause the net temperature coefficient of the gain of the differential amplifier circuit 11 to be effectively zero; so that its gain is unaffected by changes in the ambient temperature.

Input signals applied to the terminal 10 of the amplifier circuit 11 are applied to the junction of the base of the transistor 15 and the resistor 25. Because the transistor diodes 22, 23 and 24 present a low impedance (of the order of 60 ohms) relative to the values of the resistors 25 and 27, these diodes act as an AC bypass for alternating current signals; so that it is unnecessary to employ an extra bypass capacitor for preventing the AC signals from being applied to the base of the transistor 17 in the differential amplifier circuit.

Thus, the transistor diodes 22, 23 and 24 perform three functions in the circuit, namely, that of providing a voltage reference for the circuit components, temperature compensation of the gain of the amplifier 11, and AC decoupling of the two halves of the differential amplifier 11.

The amplified output signals obtained from the collector of the transistor 13 are applied through a coupling circuit 40 to a noise detection circuit 50 in the form of a peak-to-peak amplifying detector. If desired, the output of the differential amplifier 11 could be applied through an emitter follower buffer stage in order to minimize the loading effects of the detector circuit 50 on the gain of the amplifier 11. Such an emitter follower stage, however, has not been shown in the drawing.

The noise detector circuit 50 is provided with operating bias potential through a voltage divider including a resistor 51 and two transistor diodes 53 and 54 connected between the positive potential terminal 18 and ground, with the bias voltage being obtained from the junction between the resistor 51 and the transistor diode 53. This potential is applied through another transistor diode 55 to the base of an NPN transistor 56, which is an emitter-follower driving an amplifying detecting transistor 57. The collector of the transistor 57 is coupled through a load resistor 58 to the terminal 18 and its emitter is connected to ground through a resistor 52.

A filter capacitor 59 coupled to the collector of the transistor 57 is used to store the detected noise voltage, and the charge accumulated by the capacitor 59 is a direct function of the signal strength, the charge being at its lowest level with no signal and increasing in the positive direction with increasing signal strength. This voltage stored by the capacitor 59 then may be utilized to operate the squelch circuitry in the receiver.

It should be noted that the voltage drop across the two transistor diodes 53 and 54 is insufficient to forward bias the transistors 56 and 57, due to the inclusion of the transistor diode 55 in the series path with the base-emitter junctions of the transistors 56 and 57. The transistor diodes 53 and 54, however, provide a standby bias which biases the transistors 56 and 57 very near conduction in order to obtain a high detection sensitivity by the noise detector circuit 50.

The input impedance of the noise detector circuit 50 is dependent upon the beta of the transistors 56 and 57, and this transistor parameter has been found to differ with integrated circuit chips produced from different batches. In addition, the input impedance of the noise detector circuit 50 also varies with variations in ambient temperature. These input impedance variations are a significant factor in the operation of the circuit, since the coupling circuit 40 for driving the noise detector requires a high frequency pass filter with low frequency roll-off characteristics. If the beta of the transistors is changed, thereby changing the input impedance, or if temperature variation causes a change in the input impedance, the roll-off characteristics of the filter are changed considerably. As a consequence, the operation of the detector circuit would vary considerably with variations in either of these parameters.

THerefore, in order to minimize the effects of variations of the input impedance of the detector circuit 50, the coupling circuit 40 is provided with a first capacitor 61 connected in series with a capacitor 62 having a substantially greater capacitance than that of the capacitor 61. The junction between the capacitors 61 and 62 is shunted to ground through a resistor 63, and the impedance of the resistor 63 is chosen to be low compared to the input impedance of the detector circuit 50. The resistor 63 is connected in parallel with the input impedance of the circuit 50 so that it operates to effectively swamp out the effects of input impedance and to render variations of that input impedance insignificant. Thus, the detector is made relatively insensitive to device and temperature variations.

The capacitor 61, in conjunction with the parallel combination of the resistor 63 and the input impedance of the detector, operates as a high-pass filter with a low frequency roll-off characteristic. The capacitor 62 does not affect frequency shaping but is a charge accumulating capacitor to provide for a voltage doubling action of the detector circuit 50.

From the foregoing, it can be seen that the circuit shown in the drawing provides for a substantially stable operation over a range of ambient temperature variations, and further operates to compensate for differences in the beta of transistors used in the circuit.

We claim:

1. An integrated temperature compensated amplifier circuit including in combination:

first and second voltage supply terminals for connection to points of suitable operating potential, said operating potential being subject to variation with variations in temperature;

voltage divider means including resistance means and a predetermined number of transistor diode means connected in series between said first and second voltage supply terminals in the order named, with said resistance means being connected with a first one of said predetermined number of transistor diode means at a first junction;

differential amplifier means including at least first and second transistors, each having base, collector and emitter electrodes, with the emitters thereof being coupled in common at a second junction;

further resistance means coupling the base electrodes of said first and second transistors with said first junction;

a first current source including a third transistor having collector, base, and emitter electrodes, the collector thereof being coupled with said second junction, the emitter thereof being coupled with said second voltage supply terminal, and the base thereof being coupled with said transistor diode means to cause the collector current of said third transistor to vary with variations in current in said transistor diode means caused by variations in temperature, so that the collector current of said third transistor has a predetermined temperature coefficient, said predetermined number of transistor diode means being selected to provide temperature compensations for the emitter-base junctions of said first and second transistor means and said third transistor;

means for coupling the collector electrodes of said first and second transistors with said first voltage supply terminal;

resistor means coupled between said second junction and said second voltage supply terminal and having an opposite temperature coefficient to the temperature coefficient of said third transistor, said resistor means operating as a second current source for the differential amplifier; and means for applying input signals to the base electrode of one of said first and second transistors, with the predetermined number of transistor diode means operating as an alternating current bypass circuit for the input signals with respect to the base electrode of the other of said first and second transistors.

2. The combination according to claim 1 further including transistor utilization circuit means having an input impedance subject to variation with beta and temperature changes;

means coupled with the collector of one of said first and second transistors for supplying the amplified output signals from said differential amplifier to said transistor utilization circuit means; and compensation impedance means coupled in parallel with the input impedance of said utilization circuit means and having a lower impedance than said input impedance for swamping out the effect of variations in said input impedance.

3. The combination of claim 1 wherein the differential amplifier includes fourth and fifth transistors coupled in a Darlington configuration to said first and second transistors, respectively, and each having base electrodes, with said first junction being coupled with the base electrodes of said fourth and fifth transistors by said further resistance means and said input signal being applied to the base electrode of one of said fourth and fifth transistors.

4. The combination according to claim 3 wherein said voltage divider includes said first resistance means connected in series with three transistor diode means and wherein said first junction on said voltage divider is at a potential above the potential of said second voltage supply terminal as established by said three series-connected transistor diode means, said first resistance means of said voltage divider and the resistor means of said second current source having one temperature coefficient and said transistor diode means and said third current source transistor having an opposite temperature coefficient.

5. A circuit for reducing input impedance variations in a transistor circuit subject to variations with beta and temperature changes including in combination:

transistor utilization circuit means having a base-emitter circuit exhibiting an input impedance subject to substantial variation with beta and temperature changes;

input circuit means for supplying AC signals to the base-emitter circuit of said transistor utilization circuit means;

compensation impedance means coupled in parallel with the base-emitter circuit of the transistor utilization circuit means and having a lower impedance than said input impedance for swamping out the effect of variations in said input impedance; and filter means for coupling the input circuit means to the parallel combination of the utilization circuit means and the compensation impedance means.

6. The combination according to claim 5 wherein the filter means includes first and second capacitances coupled together at a common junction, with the first capacitance coupled with the input circuit and with the second capacitance coupled with the utilization circuit means, and the compensation impedance means being coupled between a point of reference potential and the junction of the first and second capacitances.

7. The combination according to claim 6 wherein the utilization circuit means is a transistor amplifying detector circuit and the first capacitance is a frequency shaping capacitance having a high pass filter characteristic with a low frequency rolloff and the second capacitance is a charge accumulating capacitance, the first capacitance being substantially smaller than the second capacitance, with the impedance being a resistance means the value of which is small compared with the input impedance of the utilization circuit means.

* * * * *